United States Patent [19]

Lee

[11] Patent Number: 5,721,155
[45] Date of Patent: Feb. 24, 1998

[54] METHOD FOR FORMING A VIA CONTACT OF A SEMICONDUCTOR DEVICE

[75] Inventor: Chang Jae Lee, Chungcheongbuk-do, Rep. of Korea

[73] Assignee: LG Semicon Co., Ltd., Chungcheongbuk-do, Rep. of Korea

[21] Appl. No.: 520,434

[22] Filed: Aug. 29, 1995

[51] Int. Cl.$^6$ .................. H01L 21/283; H01L 21/31
[52] U.S. Cl. .................. 437/195; 437/192; 437/193; 437/228
[58] Field of Search .................. 437/187, 189, 437/195, 978

[56] References Cited

U.S. PATENT DOCUMENTS

| | | | |
|---|---|---|---|
| 5,187,121 | 2/1993 | Cote et al. | 437/195 |
| 5,231,054 | 7/1993 | Kosugi | 437/192 |
| 5,233,223 | 8/1993 | Murayama | 257/770 |
| 5,275,973 | 1/1994 | Gelatos | 437/195 |

OTHER PUBLICATIONS

Wolf, S., Silicon Processing, vol. 2, Lattice Press, 1990, pp. 189–194.

*Primary Examiner*—T. N. Quach
*Attorney, Agent, or Firm*—Morgan, Lewis and Bockius, LLP

[57] ABSTRACT

A method for forming a via contact of a semiconductor device includes the steps of forming a first insulating layer on a substrate, forming a lower conducting layer on the first insulating layer, forming a third insulating layer on the lower conducting layer, forming a first photoresist on the third insulating layer, etching the third insulating layer to form a via pillar, removing the first photoresist, forming a second photoresist on the via pillar and the lower conducting layer, etching the second photoresist except on the via pillar and a portion of the lower conducting layer, forming a metal line by removing portions of the lower conducting layer from which the second photoresist has been etched, removing the second photoresist that has not been etched, forming a second insulating layer on the metal line, the first insulating layer, and the via pillar, etching the second insulating layer to expose an upper surface of the via pillar, etching the via pillar to thereby form a via hole through the second insulating layer, and forming an upper conducting layer on the second insulating layer, through the via hole, and in contact with the lower conducting layer.

18 Claims, 8 Drawing Sheets

F I G.4d
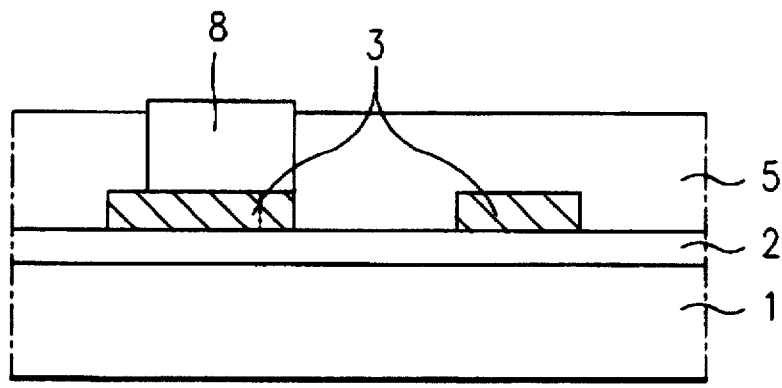
F I G.4e
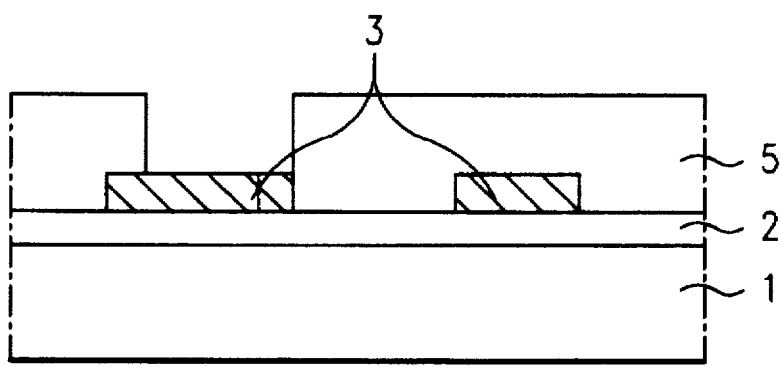
F I G.4f
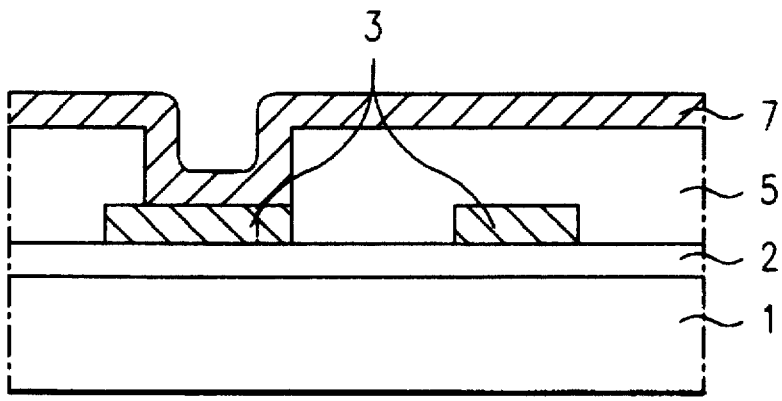

5,721,155

METHOD FOR FORMING A VIA CONTACT OF A SEMICONDUCTOR DEVICE

BACKGROUND OF THE INVENTION

1. Field of the Invention

The present invention relates to a method for forming a via contact of a semiconductor device.

2. Discussion of the Related Art

As integration of a semiconductor device increases, the electrical interconnections between elements becomes dense. In addition, the interconnection structure is altered from a single-layer interconnection form to a double-layer interconnection form. Therefore, a contact technology using a via hole to connect one metal wiring layer consisting of a conductive material to another metal wiring layer consisting of a conductive material located at different layer levels becomes the kernel of multi-layer interconnection technology. In particular, when a device requires high integration, such as a dynamic random access memory (DRAM) of greater than 256M, the size of a via hole will be less than $0.5 \times 0.5$ μm$^2$. The pad size of a metal wiring layer of a lower metal layer consisting of a conductive material connected to the via hole is less than $0.7 \times 0.7$ μm$^2$, so that it is designed with an overlap margin of less than 0.2 μm. Such a margin enables consistent contact between one conductive metal and another conductive metal.

The above-described method prevents non-contact from occurring but also causes an increase in area occupied in a highly integrated device. Furthermore, during the alignment of the i-line stepper, which is commonly used for alignment, it is difficult to control the overlay margin between patterns within 0.2 μm, according to the general manufacturing process. Therefore, during the formation of the via contact, the misalignment of the metal line of lower metal layer and the via hole connecting the metal line of lower metal layer consisting of a conductive material with the metal line of an upper metal layer consisting of a conductive material greatly influences the yield in a highly integrated mass-production. Thus, much research for securing the misalignment margin or design rule margin has been pursued which does not suggest the basic solution. In a case involving the integration of 1 Giga-bit or more is required, the misalignment problem will likely be raised again.

FIGS. 1a–1f are cross-sectional views of a conventional method for forming a via contact. In this structure, the process for forming a via contact between the metal line wiring layer of lower metal layer 13 and the metal line wiring layer of upper metal layer 17 will now be explained.

As shown in FIG. 1a, a first insulating layer 12 is grown on a substrate 11. A silicon semiconductor material is used as substrate 11, and silicon dioxide (SiO$_2$) or silicon nitride (Si$_3$N$_4$) is generally used as first insulating layer 12. On first insulating layer 12, a lower metal layer 13 is deposited by sputtering or chemical vapor deposition (CVD). Lower metal layer 13 consists of a conductive material as used in a semiconductor device, e.g., tungsten (W), titanium nitride (TIN), chrome, etc. Alternatively, the conductive material may be a conductive polysilicon or a conductive amorphous silicon.

As shown in FIG. 1b, lower metal layer 13 is etched using photolithography, and first photoresist 14 is removed. In order to pattern only the necessary wiring layer of lower metal layer 13, a first photoresist 14 is coated on the necessary portion. As a result, lower metal layer 13 is patterned, thereby obtaining the necessary wiring layer.

As shown in FIG. 1c, in order to insulate the metal line of lower metal layer 13 from the metal line of upper metal layer 17, a thick second insulating layer 15 is formed of, for example, a CVD film of a silicon oxide system.

As shown in FIG. 1d, in order to form a via contact hole connecting the metal line of lower metal layer 13 with the metal line of upper metal layer 17, a second photoresist 16 is coated on second insulating film 15 and patterned.

As shown in FIG. 1e, using the patterned second photoresist 16 as a mask, the exposed second insulating layer 15 of the region where a via hole will be formed is dry-etched until the metal line of lower metal layer 13 is exposed, thereby removing a portion of second insulating layer 15. At this time, in general, over-etching of about 200% is performed so that the metal line of lower metal layer 13 is exposed to 100% through the via hole in the entire region of silicon substrate 1.

As shown in FIG. 1f, after performing the over-etching, second photoresist 16 is removed. An upper metal layer 17 is deposited, and then, the metal line is patterned using a mask.

The conventional method has the following problems. First, in a highly integrated device, the design overlay margin between the via holes connecting the metal wiring layer of lower metal layer 13 with the metal wiring layer of upper metal layer 17 is very small. Thus, there is a good chance of misalignment as will be shown in FIGS. 2a–2c.

Further, in the case when over-etching is performed to 100% or more in order to form the via hole of 100% during the dry-etching process of forming the via hole in the mis-aligned state, first insulating layer 12 located below the metal wiring layer of lower metal layer 13 is removed by etching. Thus, the metal wiring layer of upper metal layer 17 may be in contact with substrate 11 as will also be shown in FIGS. 2a–2c.

According to the conventional method, as the integration is increased, the interconnection process may fail if the misalignment of the via hole becomes serious. FIGS. 2a–2c show an example of the misalignment that occurs when the via contact is formed according to the conventional method.

As shown in FIG. 2a, after performing the same procedure as in FIGS. 1a–1c, a second photoresist 16 is coated on second insulating film 15 and patterned. In second photoresist 16, a misalignment occurs on a portion of the metal line of lower metal layer 13 and a portion of first insulating layer 12.

As shown in FIG. 2b, a via hole for connecting the metal line of first metal layer 13 with the metal line of second metal layer 17 must be formed. In order to form the via hole, second insulating layer 15 is over-etched to 200% using dry-etching so that the surface of the metal line of lower metal layer 13 is completely exposed. During the over-etching, first insulating film 12 is also etched, so that the surface of substrate 11 is exposed. Substrate 11 is a silicon semiconductor substrate.

As shown in FIG. 2c, after removing second photoresist 16, upper metal layer 17 is deposited, so that the metal is in contact with the exposed portion of substrate 11. Therefore, the interconnection process does not yield the desired characteristics.

SUMMARY OF THE INVENTION

The present invention has been made in view of the above circumstances and has as an object to provide a method for forming a via contact of a semiconductor device, wherein a complete contact between a lower metal layer and an upper metal layer is made even if misalignment occurs between the via holes and the metal lines of lower metal layer when the metal line of lower metal layer is connected with the metal line of upper metal layer.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the method for forming a via contact of a semiconductor device of this invention comprises the steps of forming a first insulating layer on a substrate, forming a lower conducting layer on the first insulating layer, forming a third insulating layer on the lower conducting layer, forming a first photoresist on the third insulating layer, etching the third insulating layer to form a via pillar, removing the first photoresist, forming a second photoresist on the via pillar and the lower conducting layer, etching the second photoresist except on the via pillar and a portion of the lower conducting layer, forming a metal line by removing portions of the lower conducting layer from which the second photoresist has been etched, removing the second photoresist that has not been etched, forming a second insulating layer on the metal line, the first insulating layer, and the via pillar, etching the second insulating layer to expose an upper surface of the via pillar, etching the via pillar to thereby form a via hole through the second insulating layer, and forming an upper conducting layer on the second insulating layer, through the via hole, and in contact with the lower conducting layer.

BRIEF DESCRIPTION OF THE ATTACHED DRAWINGS

The accompanying drawings, which are incorporated in and constitute a part of this specification, illustrate embodiments of the invention and, together with the description, serve to explain the objects, advantages and principles of the invention.

In the drawings:

FIGS. 4a–4f are cross-sectional views of a semiconductor device illustrating an embodiment where misalignment between a via hole of the present invention and a metal line occurs.

DETAILED DESCRIPTION OF THE INVENTION

Preferred embodiments of the present invention will now be described with reference to the attached drawings.

Figure 1A:
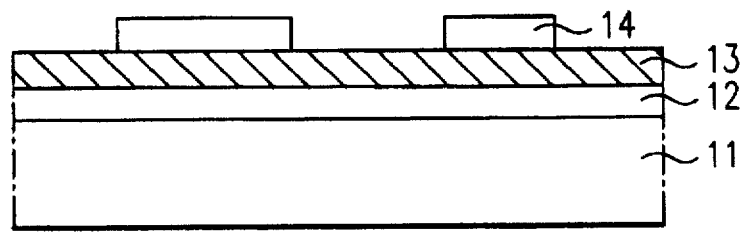
FIGS. 1a–1f are cross-sectional views of a semiconductor device illustrating the conventional method for forming a via contact.
Figure 1B:
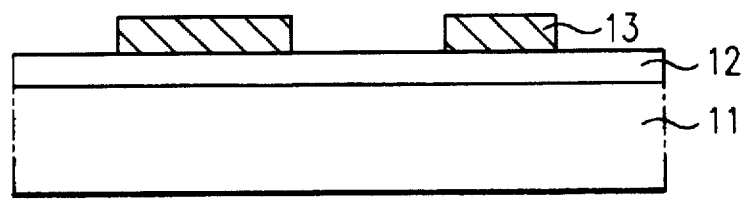
Figure 1C:
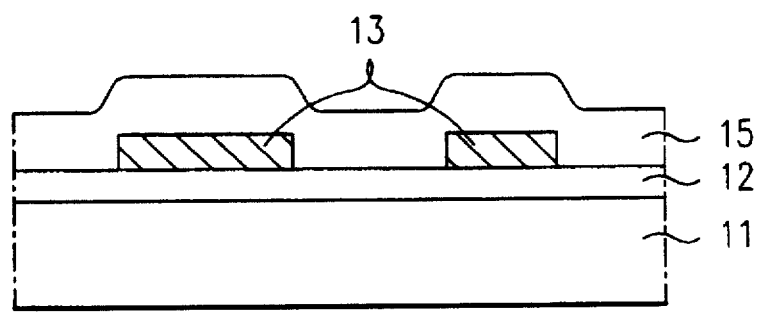
Figure 1D:
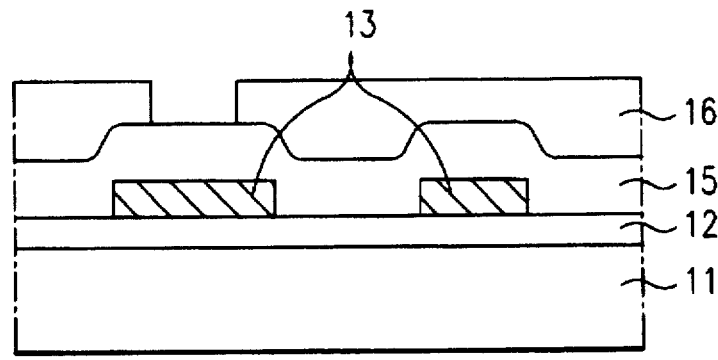
Figure 1E:
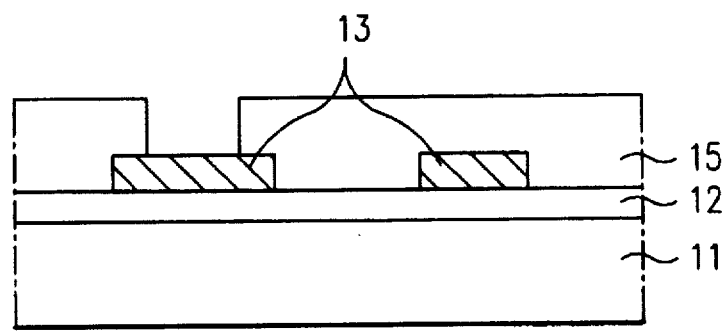
Figure 1F:
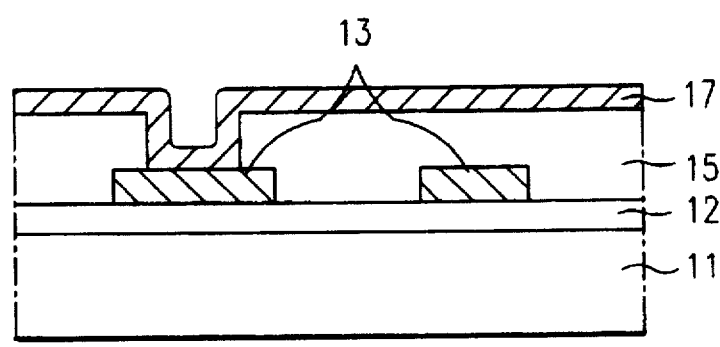
Figure 2A:
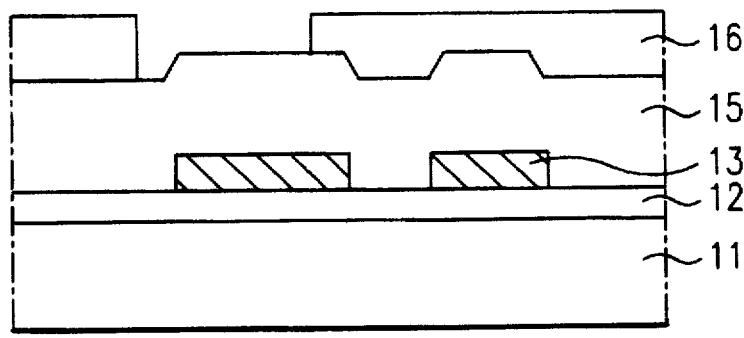
FIGS. 2a–2c are cross-sectional views of a semiconductor device illustrating an example of the conventional via contact that is mis-aligned.
Figure 2B:
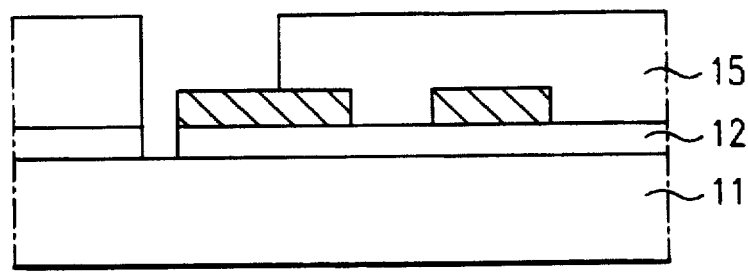
Figure 2C:
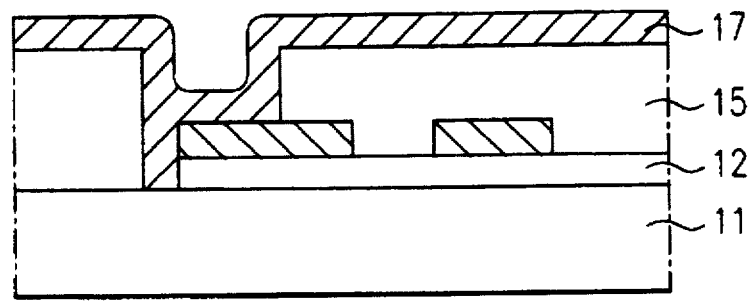
Figure 3A:
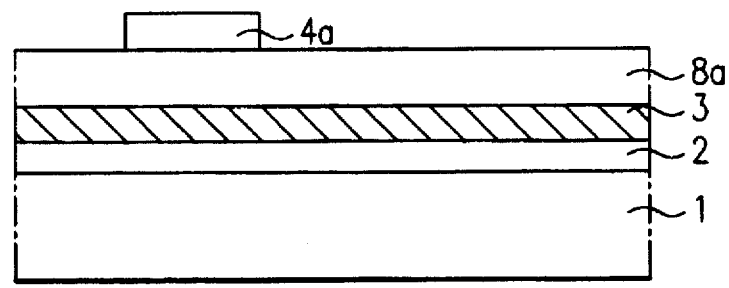
FIGS. 3a–3h are cross-sectional views of a semiconductor device illustrating a method for forming a via contact in accordance with the present invention.

As shown in FIG. 3a, a first insulating layer 2 is formed on a semiconductor substrate 1. Silicon is used for the semiconductor substrate 1. Then, a lower conducting layer 3 is deposited on first insulating layer 2. Silicon dioxide ($SiO_2$) is mainly used for first insulating layer 2. Any conductive metal can be used as lower conducting layer 3. For example, tungsten, titanium nitride (TiN), chrome, or the like can be used. Alternatively, a conductive material, such as polysilicon or amorphous silicon, can be used.

A third insulating layer 8a for a via pillar is grown on lower conducting layer 3 to a thickness of 110% of the depth of a via hole. A material having a different etching rate than that of a chemical vapor deposition (CVD) film of silicon oxide system is used as a material constituting third insulating layer 8a. A first photoresist 4a is coated on third insulating layer 8a over the portion of the potential via contact.

Figure 3B:
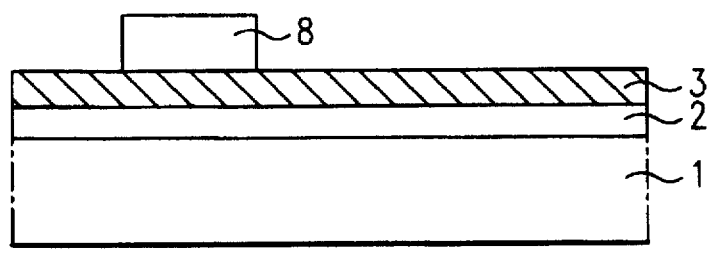

As shown in FIG. 3b, third insulating layer 8a is etched to form a via pillar 8 using the first photoresist 4a as a mask. In this manner, via pillar 8 is formed with the desired size corresponding to the via hole. First photoresist 4a is then removed.

Figure 3C:
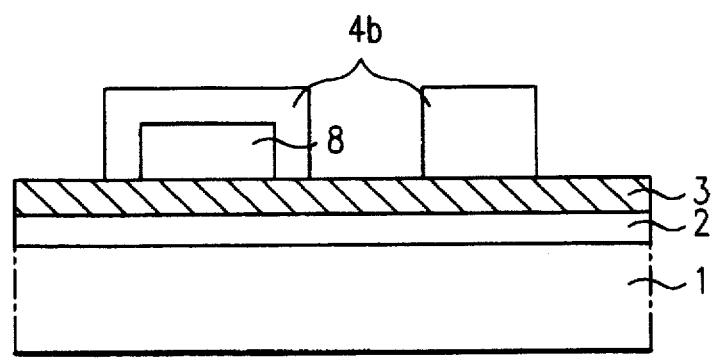

As shown in FIG. 3c, a second photoresist 4b is coated on the entire surface of the resulting structure and then patterned such that it remains on the upper surface and both sides of via pillar 8 and portions of lower conducting layer 3 where metal lines will be formed. Second photoresist 4b is patterned using a mask have a contrary image against the via hole pattern of the conventional mask, that is, a mask wherein the via hole position and the metal line portions are dark, while the other portions are bright.

Figure 3D:
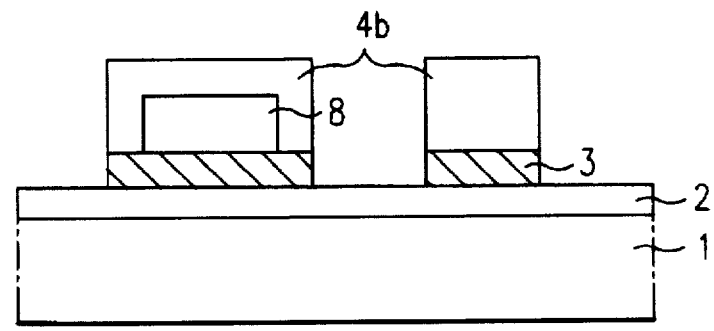
Figure 3E:
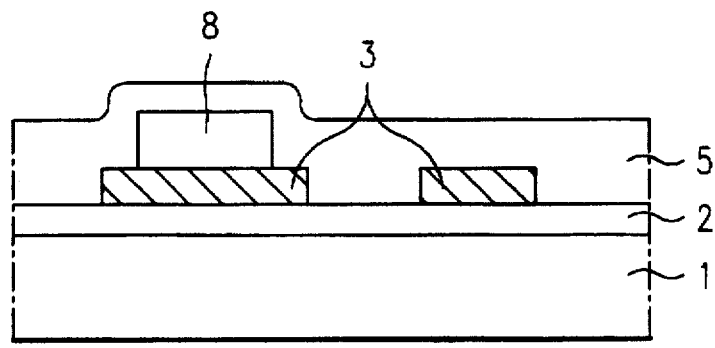

As shown in FIG. 3d, after patterning second photoresist 4b, lower conducting layer 3 is patterned using photolithography. Exposed portions of lower conducting layer 3 are then removed by etching, thereby forming the metal line of lower conducting layer As shown in FIG. 3e, second photoresist 4b is removed. Then, on first insulating layer 2, via pillar 8, and the metal line of exposed lower conducting layer 3, a flat second insulating layer 5 is grown with a thickness as thick as the depth of the via hole plus the thickness of lower conducting layer 3.

Figure 3F:
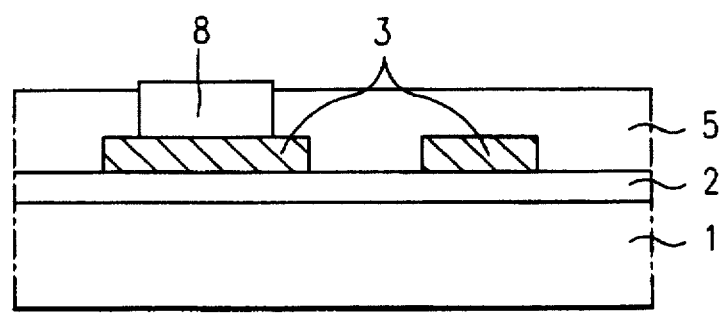

As shown in FIG. 3f, using a chemical polishing method, mechanical polishing method, or a general reactive ion etching method, second insulating layer 5 is etched, thereby exposing the upper surface of via pillar 8.

Figure 3G:
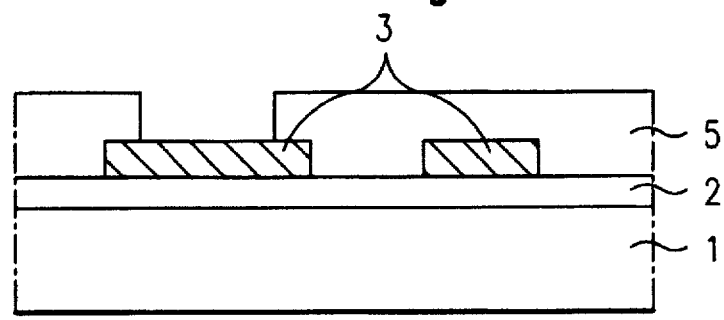

As shown in FIG. 3g, via pillar 8 is removed using wet- or dry-etching, thereby forming a via hole. As a result, the surface of lower conducting layer 3 is exposed through a via hole.

Figure 3H:
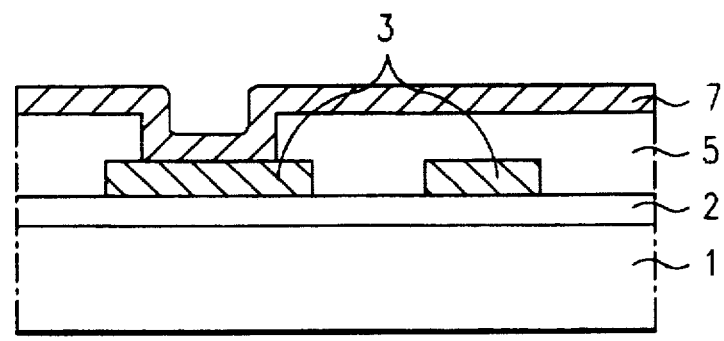

As shown in FIG. 3h, using a general sputtering method or CVD method, an upper conducting layer 7 is grown on the entire surface of the resultant structure and patterned, thereby completing the necessary metal line. As a result, the multilayer interconnection process of the present invention is completed.

FIGS. 4a–4f are cross-sectional views for showing an embodiment with a misalignment between the via hole of the present invention and metal line.

Figure 4A:
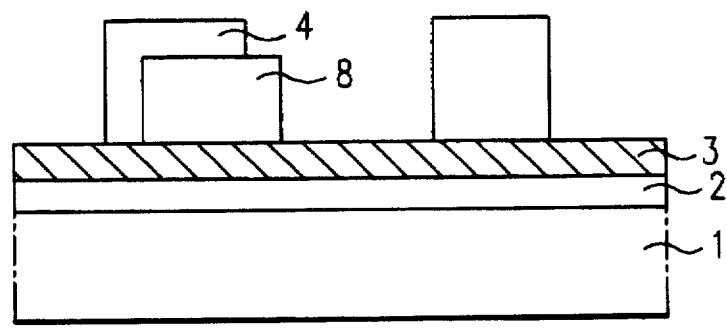

As shown in FIG. 4a, a first insulating layer 2 is grown on a semiconductor substrate 1. Silicon is used for semiconductor substrate 1, and silicon dioxide ($SiO_2$) or silicon nitride ($Si_3N_4$) is used for first insulating layer 2.

Next, a lower conducting layer 3 is grown on first insulating layer 2. Any conductive metal can be used as lower conducting layer 3. Tungsten, titanium nitride (TiN), chrome, or the like can be used as the conductive metal. The conductive material may also include a polysilicon or amorphous silicon as well as the conductive metal.

A third insulating layer 8a is grown on lower conducting layer 3. Then, the portions thereof are dry- or wet-etched through the mask work, thereby leaving a via pillar 8. An insulating material having a different etching rate than that of other insulating layers is used as a material for the via pillar 8.

In order to etch the metal of lower conducting layer 3 while leaving the necessary portions of via pillar 8 and to remove the metal, a photoresist 4 is coated on the entire surface of the resultant structure. Photoresist 4 is left on the upper surface and both sides of via pillar 8 and the necessary metal wiring layers, while other portions of photoresist 4 are removed. At this time, misalignment occurs in the photoresist 4 where via pillar 8 is formed, so that a portion of via pillar 8 is exposed. Due to the misalignment, in the present embodiment, photoresist 4 favors the left or right side of via pillar 8. In the conventional method, the fatal poor contact is generated, thereby decreasing the yield.

Figure 4B:
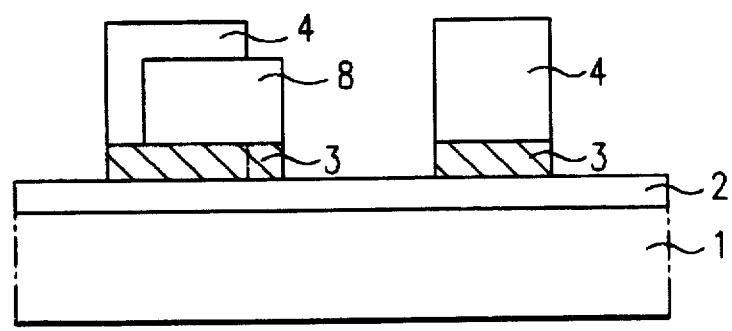

As shown in FIG. 4b, portions of lower conducting layer 3 is removed by etching using either the dry- or wet-etching method. In this step, the metal line of lower conducting layer 3 is left below photoresist 4 and via pillar 8. The metal line is prevented from being etched when lower conducting layer 3 located below the via hole of via pillar 8 is etched.

Figure 4C:
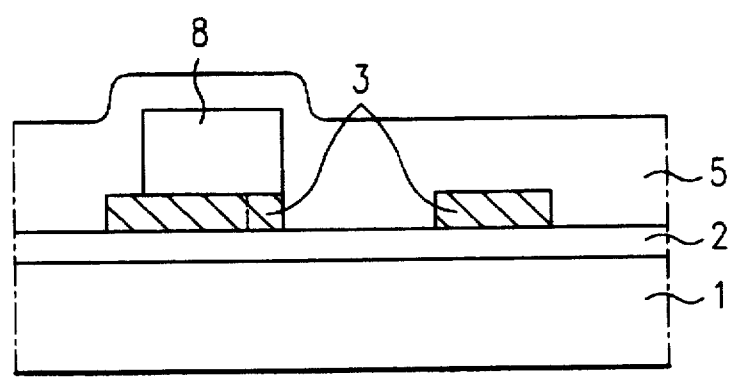

As shown in FIG. 4c, photoresist 4 is next removed. Then, on first insulating layer 2, lower conducting layer 3, and via pillar 8, a flat second insulating layer 5 is deposited having a thickness equal to the depth of the via hole plus the thickness of lower conducting layer 3. Silicon dioxide (SiO$_2$) or other insulating compound can be used for second insulating layer 5.

As shown in FIG. 4d, using chemical polishing, mechanical polishing, or reactive ion etching, second insulating layer 5 is etched, thereby exposing the upper surface of via pillar 8. At this time, second insulating layer 5 must be etched so as to cover the lower conducting layer 3 and to expose the upper surface of via pillar 8.

As shown in FIG. 4e, only via pillar 8 is etched through the wet- or dry-etching method, thereby forming a via hole. At this time, the via hole provides a path connecting lower conducting layer 3 with upper conducting layer 7. Even if photoresist 4 is mis-aligned, since the metal line of lower conducting layer 3 is left below the entire via hole, there is no problem in forming a contact lower conducting layer 3 to upper conducting layer 7.

As shown in FIG. 4f, upper conducting layer 7 is grown, so that the via contact is formed on the via hole. The metal line of lower conducting layer 3 is connected to upper conducting layer 7, thereby completing the desired contact. The metal of upper conducting layer 7 is etched so that only a portion where the interconnection will be formed is left, thereby completing the metal line.

Figure 5:
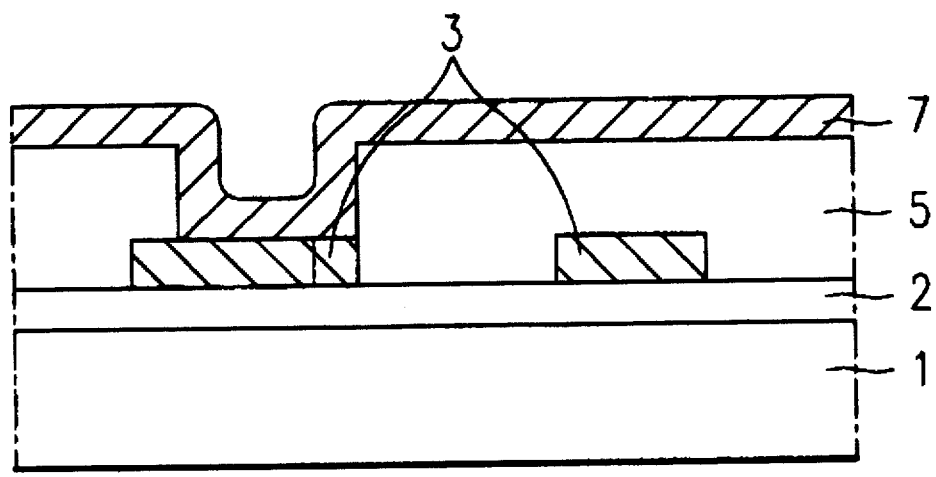
FIG. 5 is a cross-sectional view of a semiconductor device illustrating an example where the via hole of the present invention is mis-aligned.

FIG. 5 is a cross-sectional view for showing an example that the via hole of the present invention is mis-aligned.

If the same procedure described from FIG. 4a–4f is performed, the cross-sectional view shown in FIG. 4f is the same as that shown in FIG. 5. Therefore, the necessary portions of via pillar 8, photoresist 4, and lower conducting layer 3 thereunder are left after metal-etching, thereby forming the metal line. In order to form the via hole, via pillar 8 is etched using wet- or dry-etching. At this time, the metal line of lower conducting layer 3 is exposed through the via hole. On the exposed metal line and second insulating layer 5, that is, on the entire surface of the wafer, upper conducting layer 7 is deposited using a sputtering method or a CVD method. At this time, the metal line of lower conducting layer 3 is connected with upper conducting layer 7 through the via hole, thereby completing the via contact. In this manner, the successful via contact process of the multi-layer interconnection can be performed even if the misalignment occurs.

Even if the misalignment occurs in the via contact process of a multi-layer interconnection of a highly integrated device, the poor contact between the metal lines is completely avoided by forming via pillar 8 from third insulating layer 8a. Further, when the conventional via hole is formed, the over-etching process is used for definite exposition of the metal line of first metal layer 13 of FIG. 1. On the other hand, in the present invention, via pillar 8, having a different etching rate than that of other insulating layers, is formed and wet- or dry-etched, so that the first insulating layer 2 is not etched. Thus, the metal lines are not in contact with the substrate.

In addition, through the via hole, the metal line of upper conducting layer 7 and the metal line of lower conducting layer 3 are in contact with each other by the via hole size. Thus, there is no problem that the contact resistance is increased as the contact size is decreased.

Further, in the conventional method, when the via hole is etched, the over-etching is performed such that the metal line of first conducting layer 3 is completely exposed. Thus, the metal line surface of the first conducting layer 3 is degenerated due to the chemical reaction of the etching material and the metal line, thereby increasing the resistance of the via contact. On the other hand, in the present invention, over-etching is unnecessary, so that the via contact resistance is not increased.

Moreover, even if misalignment between the via hole and the metal line of lower metal conducting 3 occurs, the metal line of lower conducting layer 3 is more extended than the pattern where the via hole is formed. Thus, the upper conducting layer 7 does not contact the semiconductor substrate. Further, since unnecessary processes such as the over-etching process performed during etching the conventional via hole is omitted. Instead, the complete success of the via contact can be obtained, for example, as shown in FIG. 5.

In addition, since the device can be designed without considering the overlay margin in the process, the process is simple. Furthermore, the integration design is easy due to the reduced design margin. Particularly, in the case when the present invention is applied to the mass-production of a highly integrated device, the yield variation does not depend on the via contact variation. Thus, stable yields of the device can be improved.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for forming a via contact of a semiconductor device, comprising the steps of:

forming a first insulating layer on a substrate;

forming a lower conducting layer on the first insulating layer;

forming a third insulating layer on the lower conducting layer;

forming a first photoresist on the third insulating layer;

etching the third insulating layer to form a via pillar;

removing the first photoresist;

forming a second photoresist on the via pillar and the lower conducting layer;

etching the second photoresist except on the via pillar and a portion of the lower conducting layer;

forming a metal line by removing portions of the lower conducting layer from which the second photoresist has been etched;

removing the second photoresist that has not been etched;

forming a second insulating layer on the metal line, the first insulating layer, and the via pillar;

etching the second insulating layer to expose an upper surface of the via pillar;

etching the via pillar to thereby form a via hole through the second insulating layer; and forming an upper conducting layer on the second insulating layer, through the via hole, and in contact with the lower conducting layer.

2. The method for forming a via contact of a semiconductor device of claim 1, wherein the step of etching the second photoresist includes the step of etching the second photoresist except on an upper surface and sides of the via pillar.

3. The method for forming a via contact of a semiconductor device of claim 1, wherein the step of etching the second photoresist includes the step of etching the second photoresist except on a portion of an upper surface and a portion of the sides of the via pillar.

4. The method for forming a via contact of a semiconductor device of claim 1, wherein the substrate comprises a semiconductor silicon substrate.

5. The method for forming a via contact of a semiconductor device of claim 1, wherein each of the upper and lower conducting layer comprises a conductive material selected from the group consisting of tungsten, titanium nitride, titanium, conductive polysilicon, and conductive amorphous silicon.

6. The method for forming a via contact of a semiconductor device of claim 1, wherein the lower conducting layer and upper conducting layer are formed using a physical deposition method or a chemical deposition method.

7. The method for forming a via contact of a semiconductor device of claim 1, wherein the third insulating layer has a different etching rate from that of the first insulating layer and the second insulating layer.

8. The method for forming a via contact of a semiconductor device of claim 1, wherein the step of etching the third insulating layer includes the step of performing a wet etching process.

9. The method for forming a via contact of a semiconductor device of claim 1, wherein the upper conducting layer is in contact with the lower metal line through the via hole even when the second photoresist is misaligned.

10. A method for forming a via contact of a semiconductor device, comprising the steps of:

forming a first insulating layer on a substrate;

forming a lower conducting layer on the first insulating layer;

forming a via pillar of insulating material on a predetermined portion of the lower conducting layer;

forming a metal line by selectively removing portions of the lower conducting layer, the metal line including a portion of the lower conducting layer beneath the via pillar and extending beyond sides of the via pillar;

forming a second insulating layer on the first insulating layer, the metal line, and the via pillar;

etching the second insulating layer to expose an upper surface of the via pillar;

removing at least a portion of the via pillar to thereby form a via hole through the second insulating layer; and forming an upper conducting layer in contact with the lower conducting layer through the via hole.

11. The method for forming a via contact of a semiconductor device of claim 10, wherein the step of forming the via pillar includes the steps of:

forming a third insulating layer on the lower conducting layer;

forming a first photoresist on the third insulating layer; and etching the third insulating layer to form the via pillar.

12. The method for forming a via contact of a semiconductor device of claim 10, wherein the step of forming the metal line includes the steps of:

forming a second photoresist on the via pillar and the lower conducting layer;

etching the second photoresist except on the via pillar and a portion of the lower conducting layer; and forming the metal line by removing portions of the lower conducting layer from which the second photoresist has been etched.

13. The method for forming a via contact of a semiconductor device of claim 12, wherein the upper conducting layer is in contact with the lower metal line through the via hole even when the second photoresist is misaligned.

14. The method for forming a via contact of a semiconductor device of claim 10, wherein the upper conducting layer is also formed on the second insulating layer.

15. The method for forming a via contact of a semiconductor device of claim 10, wherein the substrate comprises a semiconductor substrate.

16. The method for forming a via contact of a semiconductor device of claim 10, wherein each of the upper and lower conducting layers includes a material selected from the group consisting of tungsten, titanium nitride, titanium, conductive polysilicon, and conductive amorphous silicon.

17. The method for forming a via contact of a semiconductor device of claim 10, wherein the etching rate of the via pillar is different that of the first insulating layer and the second insulating layer.

18. The method for forming a via contact of a semiconductor device of claim 10, wherein the lower conducting layer and upper conducting layer are formed using a physical deposition method or a chemical deposition method.

* * * * *